(12) United States Patent
Hidaka et al.

(10) Patent No.: US 11,784,079 B2
(45) Date of Patent: Oct. 10, 2023

(54) COMPOSITE SINTERED BODY, ELECTROSTATIC CHUCK MEMBER, AND ELECTROSTATIC CHUCK DEVICE

(71) Applicant: SUMITOMO OSAKA CEMENT CO., LTD., Tokyo (JP)

(72) Inventors: Nobuhiro Hidaka, Tokyo (JP); Hironori Kugimoto, Tokyo (JP)

(73) Assignee: SUMITOMO OSAKA CEMENT CO., LTD., Tokyo (JP)

( * ) Notice: Subject to any disclaimer, the term of this patent is extended or adjusted under 35 U.S.C. 154(b) by 866 days.

(21) Appl. No.: 16/619,921

(22) PCT Filed: Jun. 28, 2018

(86) PCT No.: PCT/JP2018/024727
§ 371 (c)(1),
(2) Date: Dec. 5, 2019

(87) PCT Pub. No.: WO2019/004402
PCT Pub. Date: Jan. 3, 2019

(65) Prior Publication Data
US 2020/0211884 A1    Jul. 2, 2020

(30) Foreign Application Priority Data
Jun. 29, 2017   (JP) .................. 2017-127095

(51) Int. Cl.
*H01L 21/683* (2006.01)
*C04B 35/117* (2006.01)
*H02N 13/00* (2006.01)

(52) U.S. Cl.
CPC ........ *H01L 21/6833* (2013.01); *C04B 35/117* (2013.01); *C04B 2235/3217* (2013.01); *C04B 2235/3463* (2013.01); *C04B 2235/3826* (2013.01); *C04B 2235/5472* (2013.01); *C04B 2235/785* (2013.01); *C04B 2235/786* (2013.01); *C04B 2235/80* (2013.01);
(Continued)

(58) Field of Classification Search
CPC .......... C04B 35/117; C04B 2235/3217; C04B 2235/3463; C04B 2235/3826; C04B 2235/785; C04B 2235/786; C04B 2235/80
See application file for complete search history.

(56) References Cited

U.S. PATENT DOCUMENTS

2017/0057875 A1 *   3/2017   Ishizuka ................. C04B 35/78

FOREIGN PATENT DOCUMENTS

JP      09-511481 A    11/1997
JP      4744855 B2      8/2011
(Continued)

OTHER PUBLICATIONS

WO2015137270A1 machine translation (Year: 2015).*
International Search Report for PCT/JP2018/024727 (dated Sep. 11, 2018).

*Primary Examiner* — Karl E Group
*Assistant Examiner* — Cameron K Miller
(74) *Attorney, Agent, or Firm* — Merchant & Gould P.C.

(57) ABSTRACT

A composite sintered body, wherein the composite sintered body consists of ceramic composite sintered body, the ceramic composite sintered body comprises aluminum oxide as a main phase, and silicon carbide as a sub-phase, in which the composite sintered body has mullite in crystal grains of the aluminum oxide.

16 Claims, 5 Drawing Sheets

(52) U.S. Cl.
CPC ...... *C04B 2235/85* (2013.01); *C04B 2235/87* (2013.01); *H02N 13/00* (2013.01)

(56) References Cited

FOREIGN PATENT DOCUMENTS

| | | | | |
|---|---|---|---|---|
| WO | 2015/137270 A1 | | 9/2015 | |
| WO | WO 2015/137270 | * | 9/2015 | |
| WO | WO-2015137270 A1 | * | 9/2015 | ............. C04B 35/01 |

* cited by examiner

COMPOSITE SINTERED BODY, ELECTROSTATIC CHUCK MEMBER, AND ELECTROSTATIC CHUCK DEVICE

TECHNICAL FIELD

The present invention relates to a composite sintered body, an electrostatic chuck member, and an electrostatic chuck device.

This application is a U.S. National Stage Application under 35 U.S.C. § 371 of International Patent Application No. PCT/JP2018/024727, filed on Jun. 28, 2018, which claims priority to Japanese Patent Application No. 2017-127095 filed on Jun. 29, 2017, the disclosures of all of which are hereby incorporated by reference in their entireties.

BACKGROUND

In a semiconductor manufacturing apparatus which performs a plasma process, an electrostatic chuck device is used in which a plate-shaped sample (a wafer) can be easily mounted on and fixed to a sample stage and it is possible to maintain a temperature of the wafer at a desired temperature. A Coulomb-type electrostatic chuck device is provided with an electrostatic attraction electrode that generates an electrostatic force (Coulomb's force) between a base having one principal surface which is a placing surface on which a wafer is placed, and the wafer placed on the placing surface (refer to, for example, Patent Literature No. 1). The base is usually made of a ceramic sintered body.

CITATION LIST

Patent Literature

[Patent Literature No. 1] Japanese Patent No. 4744855

SUMMARY OF INVENTION

Technical Problem

In recent years, devices using a semiconductor tend to be highly integrated. For this reason, at the time of manufacture of the device, a wiring microfabrication technique or a three-dimensional mounting technique is required. In carrying out such a processing technique, a semiconductor manufacturing apparatus is required to reduce an in-plane temperature distribution (temperature difference) of a wafer.

In this specification, there is a case where the "degree of in-plane temperature distribution (temperature difference) of a wafer placed on a sample stage" is referred to as "temperature uniformity". "High temperature uniformity" means that the in-plane temperature distribution of the wafer is small.

In the electrostatic chuck device, in order to reduce the in-plane temperature distribution (temperature difference) of the wafer, a technique for cooling the wafer placed on the sample stage by providing minute grooves in the sample stage and causing a gas refrigerant (for example, helium) to flow in the grooves is known. In order to enhance temperature uniformity in such an electrostatic chuck device, it is conceivable to increase a gas pressure of the refrigerant to improve cooling efficiency.

In a case of increase the gas pressure of the refrigerant, the electrostatic chuck device is required to have a high adsorption force such that the wafer is not detached due to the pressure received from the refrigerant. In order to obtain the high adsorption force, it is preferable that the dielectric constant of a base of the electrostatic chuck device is high. However, the dielectric constant of the base increases, a loss factor which is determined by the product of dielectric constant and dielectric loss tangent also increases.

In a semiconductor manufacturing apparatus using an electrostatic chuck device, plasma is generated by applying a radio frequency bias (RF) voltage. If a base having a large loss factor is used in the electrostatic chuck device, heat is generated due to a radio frequency electric field, and thus there is a concern that the temperature uniformity may be lowered.

Further, in not only the electrostatic chuck device but also various devices such as a heater device using a ceramic sintered body or a high-temperature furnace, the temperature uniformity often becomes problematic.

The present invention has been made in view of such circumstances and has an object to provide a new composite sintered body having high temperature uniformity. Further, the present invention has an object to provide an electrostatic chuck part and an electrostatic chuck device using such a composite sintered body.

Solution to Problem

In order to solve the above problem, according to an aspect of the present invention, there is provided a composite sintered body, wherein the composite sintered body consists of a ceramic composite sintered body, the ceramic composite sintered body comprises aluminum oxide as a main phase, and silicon carbide as a sub-phase, wherein the composite sintered body has mullite in crystal grains of the aluminum oxide.

In an aspect of the present invention, a configuration is also acceptable in which the composite sintered body does not have mullite at crystal grain boundaries of the aluminum oxide.

In the first aspect of the present invention, a configuration is also acceptable in which when crystal grains are defined such that crystal grains of the aluminum oxide are defined as first crystal grains, crystal grains which are dispersed in the crystal grains of the first crystal grains and contain the mullite are defined as second crystal grains, and crystal grains of the silicon carbide which are present at crystal grain boundaries of the first crystal grains are defined as third crystal grains, an average crystal grain size of the first crystal grains is 0.5 μm or more and 10 μm or less, and an average crystal grain size of the second crystal grains is smaller than an average crystal grain size of the third crystal grains.

In the first aspect of the present invention, a configuration is also acceptable in which when crystal grains are defined such that the crystal grains of the aluminum oxide are defined as first crystal grains, crystal grains which are dispersed in the crystal grains of the first crystal grains and contain the mullite are defined as second crystal grains, and crystal grains of the silicon carbide which are present at crystal grain boundaries of the first crystal grains are defined as third crystal grains, a ratio of a total of the second crystal grains to a total of the third crystal grains is 20% or more and 40% or less in terms of an area ratio in an arbitrary cross section of the composite sintered body.

In the first aspect of the present invention, a configuration is also acceptable in which a content of the mullite in the composite sintered body is 1.2% or more and 3.5% of less in terms of an area ratio in an arbitrary cross section of the composite sintered body.

It is also preferable that the features described above are combined with each other. The combination may be optionally selected, two optionally selected features may be combined with each other, or three or more features may be combined with each other.

According to a second aspect of the present invention, there is provided an electrostatic chuck member including: a plate-shaped base which has one principal surface as a placing surface on which a plate-shaped sample is placed, wherein the base is formed of the composite sintered body described above as a forming material; and an electrostatic attraction electrode which is provided on a side opposite to the placing surface of the base, or in an interior of the base.

According to a third aspect of the present invention, there is provided an electrostatic chuck device including the electrostatic chuck member described above.

Advantageous Effects of Invention

According to the present invention, it is possible to provide a new composite sintered body having high temperature uniformity. Further, it is possible to provide an electrostatic chuck part and an electrostatic chuck device using such a composite sintered body.

DESCRIPTION OF EMBODIMENTS

Hereinafter, a preferred example of an electrostatic chuck device according to the present embodiment, a preferred example of a composite sintered body or an electrostatic chuck member will be described with reference to FIG. 1 and the like. In all the following drawings, in order to make the drawings easy to see, there is a case where the dimensions, ratios, or the like of the respective constituent elements are appropriately changed. Further, the following examples are for specifically describing preferred examples for better understanding of the gist of the invention and do not limit the present invention unless otherwise specified. With respect to the number, the amount, a position, a size, a ratio, a member, or the like, omissions, additions, replacements, or other changes can be made within a scope which does not depart from the spirit of the present invention.

[Electrostatic Chuck Device]

Figure 1:
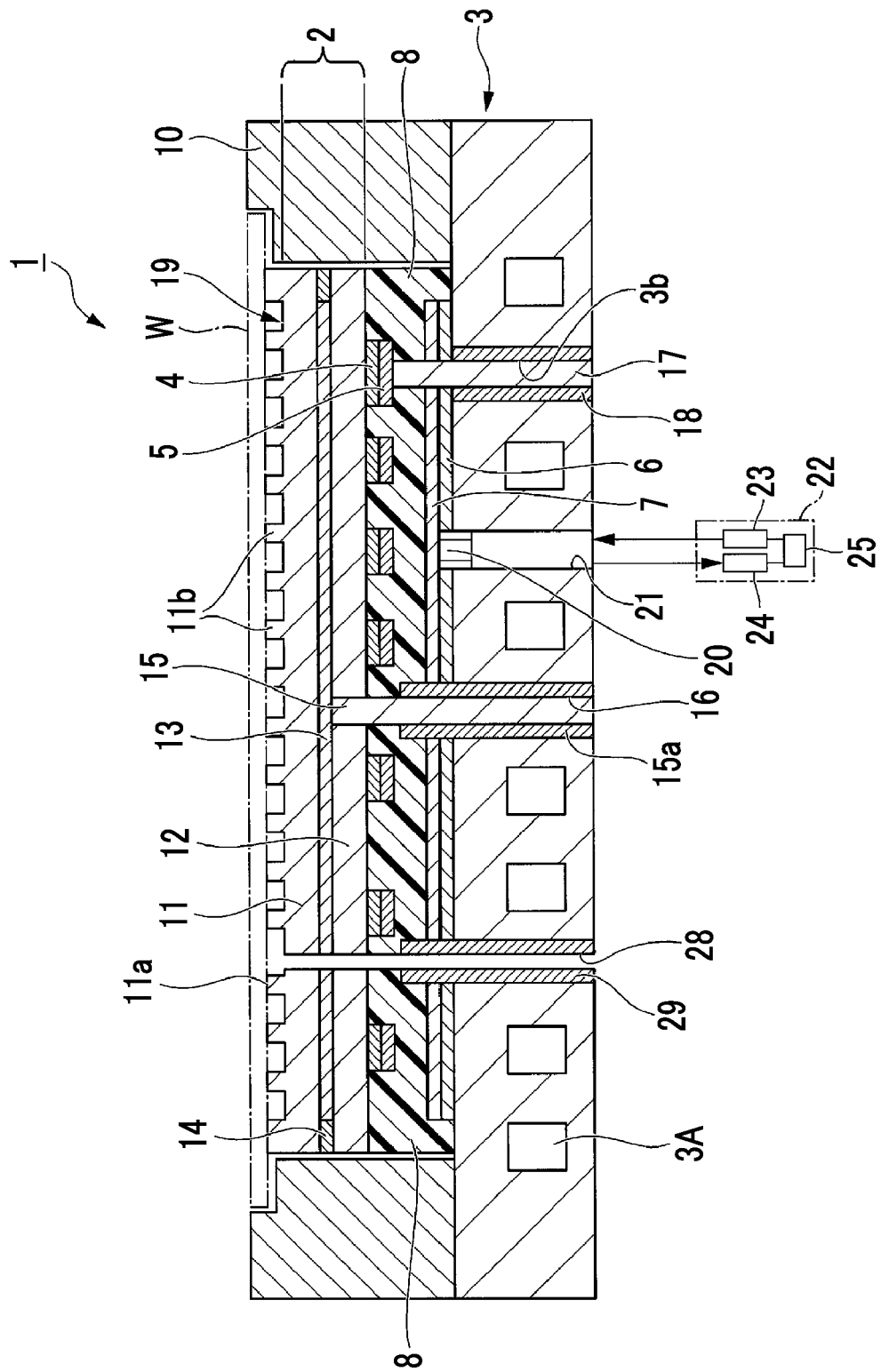
FIG. 1 is a schematic sectional view showing a preferred example of an electrostatic chuck device of the present embodiment.

FIG. 1 is a sectional view showing an electrostatic chuck device of this embodiment. An electrostatic chuck device 1 of this embodiment is preferably provided with an electrostatic chuck part 2 having a disk shape when viewed in a plan view and having a placing surface on the one principal surface (upper surface) side, and a temperature adjusting base part 3 which has a thick disk shape when viewed in a plan view and is provided below the electrostatic chuck part 2 to adjust the temperature of the electrostatic chuck part 2 to a desired temperature. Further, the electrostatic chuck part 2 and the temperature adjusting base part 3 are bonded to each other through an adhesive layer 8 provided between the electrostatic chuck part 2 and the temperature adjusting base part 3.

Hereinafter, these constituent elements will be described in order.

(Electrostatic Chuck Part)

The electrostatic chuck part 2 has a placing plate 11 having an upper surface serving as a placing surface 11*a* on which a plate-shaped sample W such as a semiconductor wafer is placed, a supporting plate 12 which is integrated with the placing plate 11 and supports the bottom portion side of the placing plate 11, an electrostatic attraction electrode 13 provided between the placing plate 11 and the supporting plate 12, and an insulating material layer 14 which insulates the surroundings of the electrostatic attraction electrode 13. Each of the placing plate 11 and the supporting plate 12 corresponds to a "base" in the present invention.

The placing plate 11 and the supporting plate 12 are preferably disk-shaped members in which the shapes of superimposed surfaces are the same. Each of the placing plate 11 and the supporting plate 12 is preferably made of a ceramic sintered body having mechanical strength and durability against corrosive gas and plasma thereof. The forming material for the placing plate 11 and the supporting plate 12 will be described in detail later.

A plurality of projection portions 11*b* each having a diameter smaller than the thickness of the plate-shaped sample are formed at predetermined intervals on the placing surface 11*a* of the placing plate 11, and the projection portions 11*b* support the plate-shaped sample W.

The thickness of the entirety including the placing plate 11, the supporting plate 12, the electrostatic attraction electrode 13, and the insulating material layer 14, that is, the thickness of the electrostatic chuck part 2 can be optionally selected. However, it is, for example, 0.7 mm or more and 5.0 mm or less.

For example, if the thickness of the electrostatic chuck part 2 falls below 0.7 mm, there is a case where it becomes difficult to secure the mechanical strength of the electrostatic chuck part 2. If the thickness of the electrostatic chuck part 2 exceeds 5.0 mm, there is a case where the thermal capacity of the electrostatic chuck part 2 is increased, and thus the thermal responsiveness of the plate-shaped sample W placed thereon deteriorates, and due to an increase in the heat transfer in a lateral direction of the electrostatic chuck part, it becomes difficult to maintain the in-plane temperature of the plate-shaped sample W at a desired temperature pattern. The thickness of each part described here is an example and is not limited to the range described above. The thickness may be optionally changed according to conditions.

The electrostatic attraction electrode 13 is used as an electrostatic chucking electrode for generating electric charges and fixing the plate-shaped sample W with an electrostatic attraction force. The shape or the size thereof can be appropriately adjusted according to the use thereof.

The electrostatic attraction electrode 13 can be formed using a material which is optionally selected. The electrostatic attraction electrode 13 is preferably formed of conductive ceramics such as an aluminum oxide-tantalum carbide ($Al_2O_3$—$Ta_4C_5$) conductive composite sintered body, an aluminum oxide-tungsten ($Al_2O_3$—W) conductive composite sintered body, an aluminum oxide-silicon carbide ($Al_2O_3$—SiC) conductive composite sintered body, an aluminum nitride-tungsten (AlN—W) conductive composite sintered body, an aluminum nitride-tantalum (AlN—Ta) conductive composite sintered body, or an yttrium oxide-molybdenum ($Y_2O_3$—Mo) conductive composite sintered body, or high melting point metal such as tungsten (W), tantalum (Ta), or molybdenum (Mo).

The thickness of the electrostatic attraction electrode 13 is not particularly limited and can be optionally selected. As the thickness of the electrostatic attraction electrode 13, for example, a thickness of 0.1 μm or more and 100 μm or less can be selected, a thickness of 1 μm or more and 50 μm or less is more preferable, and a thickness of 5 μm or more and 20 μm or less is further preferable.

If the thickness of the electrostatic attraction electrode 13 falls below 0.1 μm, there is a case where it becomes difficult to secure sufficient electrical conductivity. If the thickness of the electrostatic attraction electrode 13 exceeds 100 μm, there is a case where cracking easily occurs in the joint interfaces between the electrostatic attraction electrode 13, and the placing plate 11 and the supporting plate 12 due to a difference in coefficient of thermal expansion between the electrostatic attraction electrode 13, and the placing plate 11 and the supporting plate 12.

The electrostatic attraction electrode 13 having such a thickness can be easily formed by a film formation method such as a sputtering method or a vapor deposition method, or a coating method such as a screen printing method.

The insulating material layer 14 surrounds the electrostatic attraction electrode 13 to protect the electrostatic attraction electrode 13 from corrosive gas and plasma thereof, and joins and integrates a boundary portion between the placing plate 11 and the supporting plate 12, that is, an outer peripheral portion region except for the electrostatic attraction electrode 13. The insulating material layer 14 is formed of an insulating material having the same composition or the same main component as the material configuring the placing plate 11 and the supporting plate 12.

(Temperature Adjusting Base Part)

The temperature adjusting base part 3 is for adjusting the temperature of the electrostatic chuck part 2 to a desired temperature and is a thick disk-shaped member. As the temperature adjusting base part 3, for example, a liquid-cooling base or the like, in which a flow path 3A for circulating a refrigerant is formed in the interior thereof, can be suitably used.

As a material configuring the temperature adjusting base part 3, as long as it is metal which has excellent thermal conductivity, electrical conductivity, and workability, or a compound material which includes the metal, there is no particular limitation. For example, aluminum (Al), an aluminum alloy, copper (Cu), a copper alloy, stainless steel (SUS), or the like can be suitably used. It is preferable that at least the surface which is exposed to plasma, of the temperature adjusting base part 3, is subjected to alumite treatment or has an insulating film such as alumina formed thereon.

An insulating plate 7 is bonded to the upper surface side of the temperature adjusting base part 3 through an adhesion layer 6. The adhesion layer 6 is formed of a material which is optionally selected, and preferably made of a sheet-shaped or film-shaped adhesive resin having heat resistance and insulating properties, such as polyimide resin, silicone resin, or epoxy resin. The thickness of the adhesion layer can be optionally selected, and the adhesion layer is formed in a thickness in a range of about 5 μm to 100 μm, for example. The insulating plate 7 is preferably made of a thin plate, a sheet, or a film of resin having heat resistance, such as polyimide resin, epoxy resin, or acrylic resin.

The insulating plate 7 may be an insulating ceramic plate instead of a resin sheet, or may be a thermally sprayed film having insulating properties, such as alumina.

(Focus Ring)

A focus ring 10 is a member which has a ring shape when viewed in a plan view and is placed on a peripheral portion of the temperature adjusting base part 3. The focus ring 10 can be formed of a material which is optionally selected. However, for example, a material having electrical conductivity equivalent to that of the wafer which is placed on the placing surface is preferable as a forming material. By disposing the focus ring 10, it is possible to make an electrical environment with respect to plasma substantially coincide with that in the wafer at a peripheral portion of the wafer, and thus it is possible to make it difficult for a difference or bias in plasma treatment to occur between the central portion and the peripheral portion of the wafer.

(Other Members)

A power supply terminal 15 for applying a direct-current voltage to the electrostatic attraction electrode 13 is connected to the electrostatic attraction electrode 13. The power supply terminal 15 is inserted into a through-hole 16 penetrating the temperature adjusting base part 3, the adhesive layer 8, and the supporting plate 12 in a thickness direction. An insulator 15a having insulating properties is provided on the outer periphery side of the power supply terminal 15. The power supply terminal 15 is insulated from the temperature adjusting base part 3 made of metal, by the insulator 15a.

In FIG. 1, the power supply terminal 15 is shown as an integral member. However, the power supply terminal 15 may be configured by electrically connecting a plurality of members. The power supply terminal 15 is inserted into the temperature adjusting base part 3 and the supporting plate 12, which have different coefficients of thermal expansion. For this reason, it is also preferable that, for example, a portion which is inserted into the temperature adjusting base part 3 and a portion which is inserted into the supporting plate 12, of the power supply terminal 15, are made of different materials.

As the material of the portion (extraction electrode) connected to the electrostatic attraction electrode 13 and inserted into the supporting plate 12, of the power supply terminal 15, as long as it is a conductive material having excellent heat resistance, there is no particular limitation. For example, the material of the portion is preferably a material having a coefficient of thermal expansion which is close to the coefficients of thermal expansion of the electrostatic attraction electrode 13 and the supporting plate 12. For example, it is also preferable that it is made of a conductive ceramic material such as $A_2O_3$—TaC, for example.

The portion inserted into the temperature adjusting base part 3, of the power supply terminal 15, is preferably made of a metal material such as tungsten (W), tantalum (Ta), molybdenum (Mo), niobium (Nb), or a Kovar alloy, for example.

It is favorable if these two members are connected to each other with a silicone-based conductive adhesive having flexibility and resistance to electricity.

A heater element 5 is provided on the lower surface side of the electrostatic chuck part 2. The condition of the material, thickness, or the like of the heater element 5 can be optionally selected. As an example of the preferred heater element 5, a preferred heater element is obtained by processing a thin plate which is selected from a non-magnetic metal thin plate having a constant thickness of 0.2 mm or less, preferably about 0.1 mm, for example, a titanium (Ti) thin plate, a tungsten (W) thin plate, a molybdenum (Mo) thin plate, and the like, into a desired heater shape, for example, the entire contour having a shape in which a band-like conductive thin plate meanders, into an annular shape, by a photolithography method or laser processing.

The heater element 5 may be provided by bonding a non-magnetic metal thin plate to the electrostatic chuck part 2 and then processing and forming the non-magnetic metal thin plate on the surface of the electrostatic chuck part 2. Alternatively, the heater element 5 may be provided by transfer-printing a member processed and formed as the heater element 5 at a position different from the electrostatic chuck part 2 onto the surface of the electrostatic chuck part 2.

The heater element 5 is bonded and fixed to the bottom surface of the supporting plate 12 by an adhesion layer 4 which is made of a sheet-shaped or film-shaped silicone resin or acrylic resin having a uniform thickness and having heat resistance and insulating properties.

A power supply terminal 17 for supplying electric power to the heater element 5 is connected to the heater element 5. As the material configuring the power supply terminal 17, it is possible to use the same material as the material configuring the power supply terminal 15 described above. The power supply terminal 17 is provided so as to pass through a through-hole 3*b* formed in the temperature adjusting base part 3.

Further, a temperature sensor 20 is provided on the lower surface side of the heater element 5. In the electrostatic chuck device 1 of this embodiment, an installation hole 21 is formed so as to penetrate the temperature adjusting base part 3 and the insulating plate 7 in the thickness direction, and the temperature sensor 20 is installed at the uppermost portion of the installation hole 21. It is preferable that the temperature sensor 20 is installed at a position as close to the heater element 5 as possible. For this reason, a configuration may be made in which the installation hole 21 is formed to extend so as to protrude further toward the adhesive layer 8 side from the structure shown in FIG. 1 and the temperature sensor 20 and the heater element 5 are brought closer to each other.

The temperature sensor 20 can be optionally selected. However, as an example, a fluorescent emission type temperature sensor in which a phosphor layer is formed on the upper surface side of a rectangular parallelepiped-shaped light transmission body made of quartz glass or the like is also preferable. The temperature sensor 20 having the above configuration is bonded to the lower surface of the heater element 5 by a silicone resin-based adhesive or the like having translucency and heat resistance.

The phosphor layer is made of a material that generates fluorescence in response to heat input from the heater element 5. As the material for forming the phosphor layer, it is favorable if it is a material which generates fluorescence in response to heat generation, and a wide variety of fluorescent materials can be optionally selected. As a preferred example of the material for forming the phosphor layer, a fluorescent material to which a rare earth element having an energy level suitable for light emission is added, a semiconductor material such as AlGaAs, a metal oxide such as magnesium oxide, and a mineral such as ruby or sapphire can be given, and a material appropriately selected from these materials can be used.

The temperature sensor 20 corresponding to the heater element 5 is provided at any position which does not interfere with the power supply terminal or the like and is in a circumferential direction of the lower surface of the heater element 5.

A type or configuration of a temperature measurement part 22 which measures the temperature of the heater element 5 from the fluorescence of the temperature sensor 20 can be optionally selected. As an example, in FIG. 1, the temperature measurement part 22 is composed of an excitation unit 23 which irradiates the phosphor layer with excitation light on the outside (the lower side) of the installation hole 21 of the temperature adjusting base part 3, a fluorescence detector 24 which detects the fluorescence emitted from the phosphor layer, and a control unit 25 which controls the excitation unit 23 and the fluorescence detector 24 and calculates the temperature of a main heater, based on the fluorescence.

Further, the electrostatic chuck device 1 has a gas hole 28 provided so as to penetrate from the temperature adjusting base part 3 to the placing plate 11 in the thickness direction thereof. A tubular insulator 29 is preferably provided at an inner peripheral portion of the gas hole 28.

A gas supply device (cooling means) is connected to the gas hole 28. Cooling gas (heat transfer gas) for cooling the plate-shaped sample W is supplied from the gas supply device through the gas hole 28. The cooling gas is supplied to grooves 19 which are formed between the plurality of projection portions 11*b* on the upper surface of the placing plate 11 through the gas hole, and cools the plate-shaped sample W.

Further, it is preferable that the electrostatic chuck device 1 has a pin insertion hole (not shown) provided so as to penetrate from the temperature adjusting base part 3 to the placing plate 11 in the thickness direction thereof. The pin insertion hole can adopt the same configuration as that of the gas hole 28, for example. A lift pin for removal of the plate-shaped sample is inserted into the pin insertion hole.

The electrostatic chuck device 1 has the configuration as described above.

(Composite Sintered Body)

Figure 2:
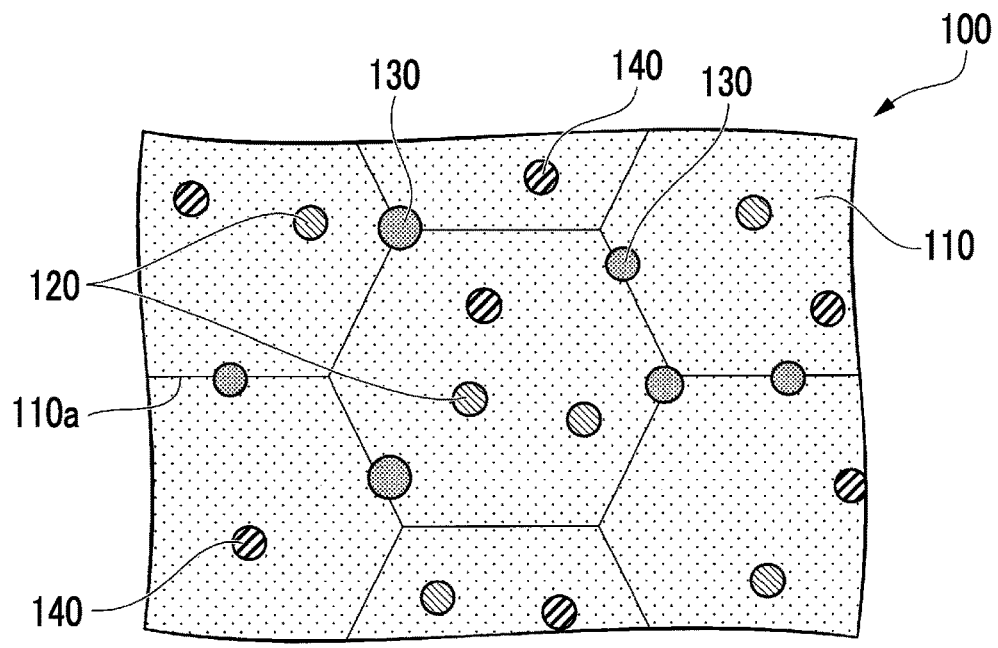
FIG. 2 is a schematic diagram showing an example of a composite sintered body according to the present invention.

Next, the base (each of the placing plate 11 and the supporting plate 12) of this embodiment will be described in detail. FIG. 2 is a schematic diagram showing an example of a composite sintered body according to the present invention, which is a preferred material for forming the base.

Hereinafter, a preferred example of the composite sintered body according to the present invention, which can be preferably used for the base, will be described.

A composite sintered body 100 is formed of a ceramic composite sintered body which includes aluminum oxide that is a main phase and silicon carbide that is a sub-phase. The composite sintered body 100 has mullite in crystal grains of the aluminum oxide. The main phase is a region having an area ratio or a volume ratio larger than 50% of the whole, and the sub-phase may be considered as a region that is not the main phase. It is also preferable that the main phase has an area ratio or a volume ratio that is larger than 75% or larger than 80%. More specifically, for example, it is also preferable that the main phase has a range of 85 to 96% by volume, and it is also more preferable that the main phase has a range of 87 to 95% by volume.

The composite sintered body 100 has a lower thermal conductivity than a sintered body in which mullite is not present. In this way, the influence of the heater of the electrostatic chuck device and a heat source such as plasma in a use environment is alleviated, and the temperature uniformity of the base as a whole is improved.

Mullite is lower in durable when exposed to plasma than silicon carbide or aluminum oxide. For this reason, if mullite is present at crystal grain boundaries of aluminum oxide, in a case where the composite sintered body 100 is used under a plasma environment, mullite at the crystal grain boundaries tends to be consumed. In this way, the composite sintered body in which mullite is present at the crystal grain boundaries easily changes in physical property under the plasma environment. If the amount of mullite which are present at the crystal grain boundaries is large, it is considered that the change in physical property also becomes large.

In contrast, in the composite sintered body 100 which is used for the base of this embodiment, mullite is present in the crystal grains of aluminum oxide. There is no or very little mullite at the crystal grain boundaries. For this reason, even if the composite sintered body 100 is used under the plasma environment, a physical property does not easily change, which is preferable.

Here, "mullite" is an aluminum silicate compound that is stable at a high temperature. As the chemical composition of mullite, a range from $3Al_2O_3 \cdot 2SiO_2$ to $2Al_2O_3SiO_2$ is possible. The Al/Si ratio of mullite can vary from 3 to 4. The "mullite" in the present invention may be a compound represented by $3Al_2O_3 \cdot 2SiO_2$ or a compound represented by $Al_6O_{13}Si_2$.

The composite sintered body 100 shown in FIG. 2 has a first crystal grain 110 that is a crystal grain of aluminum oxide, a second crystal grain 120 that is a crystal grain containing mullite, and a third crystal grain 130 that is a crystal grain of silicon carbide. The third crystal grain 130 does not contain mullite.

A plurality of second crystal grains 120 are dispersed in the crystal grain of the first crystal grain 110 in the main phase which is configured by sintering of a plurality of first crystal grains 110. Further, a plurality of third crystal grains 130 are present at crystal grain boundaries 110a of the first crystal grain 110.

In addition, the composite sintered body 100 also has a fourth crystal grain 140 that is a crystal grain of silicon carbide. The fourth crystal grains are dispersed in the crystal grain of the first crystal grain 110. The fourth crystal grain 140 also does not contain mullite. In the crystal grains of silicon carbide, the third crystal grains 130 are present at the crystal grain boundaries, and the fourth crystal grains 140 are dispersed in the crystal grain of the first crystal grain. The average crystal grain size of the fourth crystal grains can be optionally selected. However, it is preferably in a range of 0.04 to 0.8 µm, more preferably in a range of 0.1 to 0.3 µm. The average grain size of the fourth crystal grains 140 is preferably smaller than the average grain size of the third crystal grains 130.

The second crystal grain 120 containing mullite can be confirmed by, for example, elemental analysis of any cross section of the composite sintered body 100 by energy dispersive X-ray analysis (EDX). It can be determined that mullite is produced by the reaction of silicon carbide with aluminum oxide at a "location where a carbon atom is not detected", among "locations where a silicon atom is detected" by EDX. A crystal grain including a location where mullite is produced is specified as the second crystal grain 120.

The average crystal grain size of the first crystal grains 110 may be optionally selected. However, it is preferably 0.5 µm or more and 10 µm or less, and more preferably 0.8 µm or more and 1.6 µm or less. If the average crystal grain size of the first crystal grains 110 is 0.5 µm or more, the number of grain boundaries does not become excessively large, and thus a decrease in thermal conductivity can be suppressed. For this reason, when the composite sintered body 100 is heated or cooled, it becomes easy to follow a temperature change. As will be described later, the average crystal grain size of the first crystal grains is obtained by taking an electron micrograph, calculating the major axis diameters of the crystal grains of 200 or more first crystal grains, and making the arithmetic average value the average crystal grain size.

Further, if the average crystal grain size of the first crystal grains 110 is 10 µm or less, the number of grain boundaries does not become excessively small, and thus an increase in thermal conductivity can be suppressed. For this reason, it becomes easy for the composite sintered body 100 to ensure temperature uniformity.

The second crystal grain 120 includes mullite which is produced by the reaction of silicon carbide with aluminum oxide, which are raw materials of the composite sintered body 100. In a case of focusing on one second crystal grain 120, the second crystal grain 120 may partially include mullite and the remainder may be silicon carbide, or the second crystal grain 120 may be composed of only mullite. In a case of partially including mullite, the proportion of mullite in the second crystal grain can be set as necessary.

The average crystal grain size of the second crystal grains 120 is preferably smaller than the average crystal grain size of the third crystal grains 130. The average crystal grain size of the second crystal grains 120 can be optionally selected. For example, in the composite sintered body of this embodiment, the average crystal grain size of the second crystal grains 120 is preferably 0.03 µm or more and 0.2 µm or less.

The average crystal grain size of the second crystal grains 120 is 0.03 µm or more, whereby the second crystal grains 120 can sufficiently affect the thermal conductivity of the composite sintered body 100. Further, the average grain size of the second crystal grains 120 is 0.2 µm or less, whereby mullite is suitably formed.

The average crystal grain size of the third crystal grains 130 can be optionally selected. However, it is preferably 0.9 µm or less. The average crystal grain size of the third crystal grains 130 is 0.9 µm or less, whereby the electric field which is applied to the composite sintered body 100 is not easily attenuated in the interior of the third crystal grain, and thus a loss factor does not easily deteriorate. The lower limit of the average crystal grain size of the third crystal grains 130 can be optionally selected.

It is preferable that the second crystal grain 120 is smaller than the third crystal grain 130 at the grain boundary. The smaller the second crystal grain 120, the more mullitization becomes easy and the more easily a desired physical property is obtained. The mullitization means that a crystal containing mullite is formed.

In any cross section of the composite sintered body 100, the ratio of a total of the second crystal grains 120 to a total of the third crystal grains 130 can be optionally selected. However, it is preferable that the ratio is 20% or more and 40% or less in terms of an area ratio. The ratio may be 25% or more in terms of an area ratio. The ratio may be 35% or less in terms of an area ratio.

In the composite sintered body, in a case where the ratio of a total of the second crystal grains 120 to a total of the third crystal grains 130 is 20% or more and 40% or less in terms of an area ratio, it becomes easy to make the mullite content rate a desired value (described later). Further, it is easy to obtain a desired physical property.

In the present invention, the "ratio of a total of the second crystal grains 120" in the composite sintered body 100 is calculated from a scanning electron micrograph of a optionally selected field of view of the composite sintered body.

That is, an electron micrograph at a magnification of 10000 times is taken in a optionally selected field of view, and the total area of the crystal grains of silicon carbide (the third crystal grains 130) present at the crystal grain boundaries shown in the electron micrograph is set to be the area of a "total of the third crystal grains 130". On the other hand, in the electron micrograph, the "second crystal grain 120" is specified by the above-described method, and the area of a "total of the second crystal grains 120" is obtained. From the area obtained in this way, the ratio of a "total of the second crystal grains 120" to a "total of the third crystal grains 130" is obtained in terms of an area ratio.

The same processing is also performed on another portion in the composite sintered body 100, and evaluation is performed in electron micrographs of two fields of view, and thus the average value is determined as an area ratio indicating the ratio of a "total of the second crystal grains 120 to a total of the third crystal grains 130".

In addition to the third crystal grain 130, a crystal grain containing mullite similar to the second crystal grain 120 may be present at the crystal grain boundary 110a. However, it is preferable that mullite is not present at the crystal grain boundary 110a. The crystal grain containing mullite, which is present at the crystal grain boundary 110a, is not determined as the second crystal grain 120.

The area ratio between the second crystal grain 120 and the crystal grain containing mullite, which is present at the crystal grain boundary 110a, can be optionally selected. The area ratio between the second crystal grain 120 and the crystal grain containing mullite, which is present at the crystal grain boundary 110a, may be, for example, an area ratio such as 100 to 90:0 to 10, may be an area ratio such as 100 to 95:0 to 5, or may be an area ratio such as 100 to 99:0 to 1.

In the composite sintered body of this embodiment, the average crystal grain size of the crystal grains of silicon carbide which is included in the composite sintered body 100, that is, the average crystal grain size of the crystal grains of silicon carbide in which the third crystal grain 130 and the fourth crystal grain 140 are combined can be optionally selected. However, it is preferably 0.2 µm or more and 0.8 µm or less.

The crystal grains of silicon carbide having a large crystal grain size easily follow the grain boundary movement of alumina during the growth of an alumina grain, and the existing position is easily changed according to the growth of the alumina crystal grain. For this reason, the crystal grains of silicon carbide having a large crystal grain size are rejected without being incorporated into the grain-growing alumina and are easily located at the crystal grain boundaries of the sintered body.

On the other hand, as described above, silicon carbide having an average crystal grain size as small as 0.2 µm or more and 0.8 µm or less does not easily follow the grain boundary movement of alumina during the growth of an alumina grain. For this reason, the crystal grains of silicon carbide having a small crystal grain size are easily incorporated into the grain-growing alumina.

As a result, silicon carbide which is present in the alumina grain tends to have a smaller crystal grain size than silicon carbide which is present at the crystal grain boundary.

The area ratio between the third crystal grains 130 and the fourth crystal grains 140 can be optionally selected.

In the composite sintered body of this embodiment, the content rate of mullite with respect to the composite sintered body 100 can be optionally selected. However, it is preferable that it is 1.2% or more and 3.5% or less in terms of an area ratio in a cross section which is optionally selected. The content rate of mullite is set to be 1.2% or more in terms of an area ratio, whereby sufficient thermal conductivity can be secured. The content rate of mullite is set to be 3.5% or less, whereby the thermal conductivity does not excessively decrease, and when the composite sintered body 100 is used as the base of the electrostatic chuck device, a temperature increase and decrease rate is easily set to a desired state. The area ratio may be 1.5% or more, 2.0% or more, or 2.5% or more. The area ratio may be 3.0% or less, 2.5% or less, or 2.0% or less.

The composite sintered body 100 that is a material for forming the placing plate 11 and the supporting plate 12 is high in temperature uniformity due to the configuration as described above.

It is known that a large number of crystal structures are present in silicon carbide (SiC), and silicon carbide having a 3C type (zincblende type) crystal structure in a cubic system, silicon carbide having a wurtzite type crystal structure in a hexagonal system of a 4H type, a 6H type, or the like, and silicon carbide having a 15R type crystal structure in a rhombohedral system can be given as examples. Among these, the silicon carbide having a 3C type crystal structure is referred to as "β-SiC". Further, all the silicon carbides having crystal structures other than the 3C type crystal structure are referred to as "α-SiC". Any silicon carbide can be used. However, β-SiC can be particularly preferably included in the composite sintered body.

In the placing plate 11 and the supporting plate 12 of this embodiment, it is preferable that SiC which is included in the composite sintered body is β-SiC. Further, in the sintered body, it is preferable that the crystal grains of β-SiC are present to be dispersed in a state of being surrounded by the crystal grains of a metal oxide which is a matrix material. In the sintered body, the volume ratio of β-SiC can be optionally selected. SiC, preferably, β-SiC is preferably 4% by volume or more and 15% by volume or less, and more preferably 5% by volume or more and 13% by volume or less, with respect to the entire composite sintered body.

If the volume ratio of SiC, preferably, β-SiC is smaller than 4% by volume, there is a case where the expression effect of electron conductivity by SiC particles is small. Further, if the volume ratio of β-SiC is larger than 15% by volume, there is a possibility that SiC particles may come into contact with each other to cause a decrease in resistance value through SiC particles.

Further, in the composite sintered body of this embodiment, the amount of metal impurities other than aluminum and silicon is preferably 100 ppm or less. The amount of metal impurities is preferably 50 ppm or less and more preferably 25 ppm or less.

[Method of Manufacturing Composite Sintered Body]

The composite sintered body according to this embodiment can be preferably manufactured by mixing and sintering aluminum oxide particles and silicon carbide particles. At that time, the composite sintered body described above can be preferably manufactured by control (i) to increase the amount of silicon carbide particles and (ii) to reduce the particle size of the silicon carbide particle, with respect to the silicon carbide particles that are sintered to be incorporated into a plurality of aluminum oxide particles. The composite sintered body according to the present invention can be obtained by this manufacturing method.

(i) When a plurality of aluminum oxide particles are sintered to become the first crystal grains 110, if the amount of silicon carbide particles incorporated into the interior increases, the aluminum oxide particle and the silicon carbide particle easily react with each other as a probability theory. As a result, mullite is easily produced in the crystal grain of the first crystal grain 110.

(ii) When a plurality of aluminum oxide particles are sintered to become the first crystal grains 110, if the particle size of the silicon carbide particle incorporated into the interior is small, the reactivity of the silicon carbide particle increases, and thus the aluminum oxide particle and the silicon carbide particle easily react with each other kinetically. As a result, mullite is easily produced in the crystal grain of the first crystal grain 110.

As an example, the composite sintered body according to the present invention or the composite sintered body according to this embodiment can be suitably manufactured by the following method.

A method of manufacturing the composite sintered body of this embodiment includes:

(a) a step of mixing the aluminum oxide particles and the silicon carbide particles while causing the aluminum oxide particles and the silicon carbide particles to collide with each other by injecting them at high speed;

(b) a step of adjusting pH of slurry obtained in the mixing step to a range in which the surface charges of the aluminum oxide particles in the slurry become positive and the surface charges of the silicon carbide particles in the slurry become negative;

(c) a step of forming a formed body after the pH is adjusted and a dispersion medium is removed from the slurry; and (d) a step of pressure-sintering the obtained formed body by heating the formed body to a temperature of 1600° C. or higher while compacting the formed body with a pressure of 25 MPa or more under a non-oxidative atmosphere.

In the method of manufacturing the composite sintered body according to this embodiment, it is preferable that the aluminum oxide particles which are used have an aluminum oxide content of 99.99% or more. Such high-purity aluminum oxide particles can be adjusted by using an alum method. In the aluminum oxide particles adjusted by using the alum method, the content of sodium atoms which are metal impurities can be significantly reduced compared to aluminum oxide particles adjusted by using, for example, a Bayer method. Further, as long as aluminum oxide particles having a desired purity can be obtained, various methods can be adopted.

The above steps will be described below.

((a) Mixing Step)

In the mixing step, aluminum oxide particles dispersed in a dispersion medium and silicon carbide particles dispersed in a dispersion medium (dispersion liquids) are prepared. It is preferable to mix the dispersion liquids while causing the particles to collide with each other by injecting the dispersion liquids at high speed by pressurizing the dispersion liquids, by using a two-stream particle collision type pulverizing and mixing device. In this way, the aluminum oxide particles and the silicon carbide particles are pulverized and a dispersion liquid containing these pulverized particles is obtained. In this step, it is favorable if the slurries injected separately at high speed collide with each other. The speed at which the slurries collide with each other may be optionally selected.

When causing the aluminum oxide particles and the silicon carbide particles to collide with each other, large particles have large kinetic energy at the time of collision and are easily pulverized. On the other hand, small particles have small kinetic energy at the time of collision and are not easily pulverized. For this reason, the aluminum oxide particles and the silicon carbide particles which are obtained by using the pulverizing and mixing device described above become particles with few coarse particles or excessively pulverized particles and having a narrow particle size distribution width. Therefore, if the mixed particles pulverized and mixed by using the two-stream particle collision type pulverizing and mixing device are used, abnormal grain growth with coarse particles as nuclei can be suppressed in the sintering step.

Further, in a case of performing the pulverizing and mixing by using such a pulverizing and mixing device, for example, compared to a method of performing pulverizing and mixing by using media such as a ball mill or a bead mill, it is possible to suppress mixing-in of impurities due to damage to each medium.

The method of manufacturing the composite sintered body according to this embodiment may include a step of performing oxidation treatment on the surfaces of the silicon carbide particles in advance by heating the silicon carbide particles to be used, under an oxidizing atmosphere. Hereinafter, the oxidation treatment is referred to as "pre-oxidation".

The temperature condition of the pre-oxidation can be optionally selected. However, it is preferably 300° C. or more and 500° C. or less. If the pre-oxidation temperature is 300° C. or more, the surface of the silicon carbide particle can be oxidized. Further, if the pre-oxidation temperature is 500° C. or less, the oxidation of the surface of the silicon carbide particle does not proceed excessively. For example, if the oxidation temperature is set to 600° C. or more, the oxidation of the surface of the silicon carbide particles excessively proceeds, and as a result, there is a concern that the silicon carbide particles may be bonded to each other through oxide films on the particle surfaces and coarsened.

The pre-oxidation time can be optionally selected. However, it is preferably 10 hours or more. In a case where the pre-oxidation time is less than 10 hours, the oxidation does not proceed sufficiently. The pre-oxidation time may be a long time (for example, 50 hours). However, the oxide film amount does not substantially change after a certain amount of oxide films is formed. For this reason, the pre-oxidation time is preferably 10 hours or more and 20 hours or less, for example.

By pre-oxidizing the silicon carbide particles, the hydrophilicity of the silicon carbide particles is increased. In this way, the dispersibility of the silicon carbide particles in the slurry is improved.

The kind of the dispersion medium can be optionally selected. However, for example, distilled water or the like can be preferably used.

The ratio of the aluminum oxide particles and the silicon carbide particles which are used for mixing can be optionally selected. However, it is preferably 85 to 96/4 to 15 and more preferably 87 to 95/5 to 13 in volume ratio.

The particle diameter of the aluminum oxide particle dispersed in the dispersion medium can be optionally selected. However, it is preferably in a range of 0.1 to 0.3 μm, and more preferably in a range of 0.15 to 0.25 μm.

The particle diameter of the silicon carbide particle in the dispersion medium before injection can be optionally selected. However, it is preferably in a range of 10 to 150 nm, and more preferably in a range of 30 to 100 nm.

The ratio of the aluminum oxide particles among the particles in the dispersion medium before injection can be optionally selected. However, for example, it is preferably in a range of 85 to 96% by volume, and preferably in a range of 87 to 95% by volume.

The ratio of the silicon carbide particles among the particles in the dispersion medium before injection can be optionally selected. However, for example, it is preferably in a range of 4 to 15% by volume, and preferably in a range of 5 to 13% by volume.

The ratio of the total amount of the silicon carbide particles and the aluminum oxide particles to the amount of the dispersion medium in the dispersion medium before injection can be optionally selected. For example, as an example of a lower limit value, 10% by mass or more, 20% by mass or more, 30% by mass or more, or 40% by mass or more can be given. As an example of an upper limit value, 90% by mass or less, 80% by mass or less, 70% by mass or less, or the like can be preferably given.

The method of preparing the aluminum oxide particles and the silicon carbide particles dispersed in the dispersion medium, which is used in the pulverization and mixing, can be optionally selected. For example, the aluminum oxide particles and the silicon carbide particles may be added to the dispersion medium continuously or simultaneously. Alternatively, the aluminum oxide particles may be dispersed in a dispersion medium, and the silicon carbide particles may be dispersed in the same dispersion medium prepared separately. These two dispersion liquids may be mixed and used, or may be injected separately.

Further, a dispersant may be added to any amount of a dispersion medium in advance and used. The dispersant can be optionally selected.

((b) Step of Adjusting pH)

The pH of the obtained mixed solution (slurry) is adjusted. In this step, the pH adjustment is performed in consideration of the surface charges of the aluminum oxide particles and the silicon carbide particles which are contained in the slurry. The slurry obtained in the mixing step (the slurry before the pH adjustment) usually exhibits a basicity of about pH 11.

Figure 3:
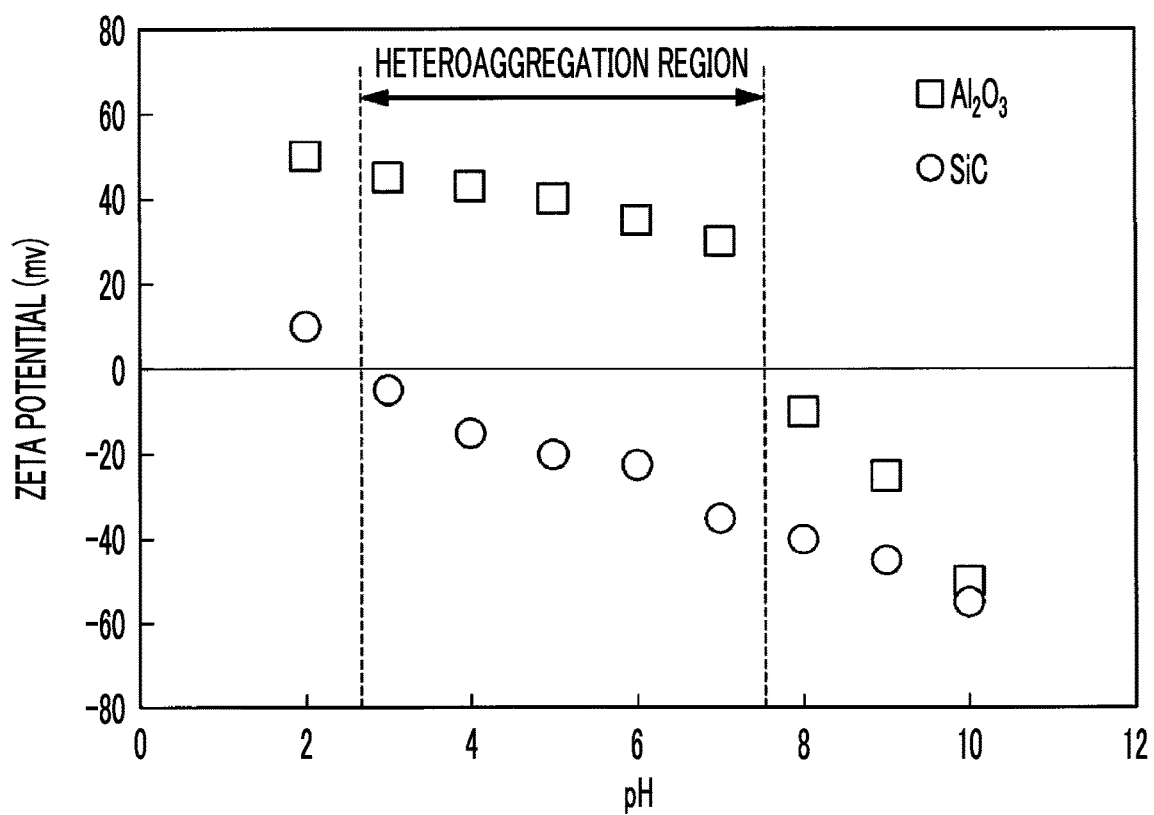
FIG. 3 is a graph showing a relationship between slurry pH and a ζ potential of a particle in slurry.

FIG. 3 is a graph showing the relationship between pH of the slurry and a ζ potential of a particle with respect to the aluminum oxide particles and the silicon carbide particles in the slurry. In the drawing, the horizontal axis indicates pH of the slurry, and the vertical axis indicates the ζ potential (unit: mV) of each particle. Here, the solvent of the slurry before the pH adjustment is 0.1N NH4NO3.

As shown in the drawing, in a case where pH of a system is on the acidity side (pH<7), the aluminum oxide particle has a positive ζ potential. This is because, in a case where the pH of the system is on the acidity side, a hydroxyl group on the surface of the aluminum oxide particle is protonated ($H^+$) and the surface is positively charged.

On the other hand, in a case where the pH of the system is on the basicity side (pH>7), the aluminum oxide particle has a negative ζ potential. This is because, in a case where the pH of the system is on the basicity side, a proton is dissociated from the hydroxyl group on the surface of the aluminum oxide particle and the surface is negatively charged.

In contrast, the behavior of the ζ potential of the silicon carbide particle is different. As shown in the drawing, the silicon carbide particle has a ζ potential of 0 at around pH 2 to 3 and has a negative ζ potential in a wide range from an acidic region at around pH 3 to a basic region.

In a case where two particles having such a relationship coexist in the same slurry, so-called heteroaggregation in which both particles aggregate occurs in the range of the pH of the system in which the "surface charge of the aluminum oxide particle in the slurry is positive" and the "surface charge of the silicon carbide particle in the slurry is negative".

At this time, it is favorable if a dispersant is appropriately added to the slurry such that the aluminum oxide particles and the silicon carbide particles do not precipitate.

The pH of the system is preferably 3 or more and 7 or less, more preferably 5 or more and 7 or less, and further preferably 6 or more and 7 or less. In a case where the ζ potentials of both particles after the pH adjustment are compared with each other, the closer to each other the absolute values of the ζ potentials are, the more easily the heteroaggregation occurs, and thus a desired aggregation state is obtained.

The pH adjustment to the above range can be performed by adding an acid to the slurry. As usable acids, inorganic acids such as nitric acid, phosphoric acid, hydrochloric acid, and sulfuric acid, and an organic acid such as acetic acid can be given as examples. Among these, hydrochloric acid, sulfuric acid, or the like generates chlorine or sulfur in an apparatus in the sintering step (described later), and thus there is a possibility that it may cause deterioration of the apparatus. For this reason, it is preferable to use nitric acid, phosphoric acid, an organic acid, or the like for the pH adjustment.

((c) Forming Step)

In the forming step, first, the dispersion liquid (slurry) after the pH adjustment is spray-dried. In this way, dray granules composed of mixed particles of the aluminum oxide particles and the silicon carbide particles are obtained.

Subsequently, the obtained granules are formed, for example, uniaxially formed (formed with uniaxial press) according to the shape of an aimed sintered body.

Subsequently, the obtained formed body is heated to a temperature which is optionally selected, at normal pressure (without applying a press pressure) under an inert gas atmosphere. It is heated to, for example, 500° C., thereby removing contaminants such as moisture or the dispersion medium, which are included in the formed body. As inert gas, nitrogen or argon can be used. In this operation, as long as the contaminants can be removed from the formed body without modifying the formed body, the heating temperature is not limited to 500° C. For example, a temperature in a range of 350° C. to 600° C., or more preferably in a range of 450° C. to 550° C. can be given as an example.

Further, it is preferable to include an oxidation step of performing oxidation treatment on the mixed particles configuring the formed body by heating the formed body from which the contaminants have been removed, to a temperature which is selected as necessary, for example, 400° C., in the atmosphere. According to such an operation, in the oxidation treatment, oxide films are formed on the surfaces of the silicon carbide particles which are included in the mixed particles. Metal impurities which are included in the mixed particles easily elute to the oxide film. For this reason, the metal impurities which are included in the mixed particles are present to be biased to the surfaces of the particles. Then, in a pressure-sintering step which will be described later, the metal impurities can be easily removed, which is preferable. The temperature of the oxidation treatment is not limited to 400° C., and for example, as necessary, a temperature in a range of 250° C. to 500° C., more preferably in a range of 300° C. to 450° C., or the like can be given as an example. The time for the oxidation treatment can be optionally selected. However, for example, a time in a range of 6 to 48 hours, more preferably in a range of 12 to 24 hours can be given as an example.

((d) Pressure-Sintering Step)

In the pressure-calcination step, first, the above-described formed body obtained in the above step is heated (preliminarily heated) to a temperature lower than 1600° C. and at normal pressure (without applying a press pressure) in a vacuum atmosphere (a first non-oxidative atmosphere). According to such an operation, by appropriately setting the temperature at the time of the preliminary heating, metal impurities such as alkali metal, which are included in the mixed particles, evaporate, and thus the metal impurities can be easily removed. For this reason, according to such an operation, the purity of the mixed particles is easily improved, and the volume resistivity value of the base is easily controlled. The temperature lower than 1600° C. can be selected as necessary.

Further, if in the forming step, the oxidation treatment is performed on the formed body from which contaminants have been removed as described above, the oxide film formed on the particle surface is volatilized by performing the preliminary heating under a vacuum atmosphere in this step. At the same time, the metal impurities included in the oxide film evaporate. For this reason, the metal impurities can be easily removed from the formed body. Therefore, according to such an operation, the purity of the mixed particles is easily improved, and the volume resistivity value of the base is easily controlled.

In this embodiment, the term "vacuum" refers to a "state in a space filled with a gas and having a pressure lower than the atmospheric pressure" and a state defined as an industrially usable pressure in the JIS standard. In this embodiment, the vacuum atmosphere may be low vacuum (100 Pa or higher). However, medium vacuum (in a range of 0.1 Pa to 100 Pa) is also preferable, and high vacuum (in a range of $10^{-5}$ Pa to 0.1 Pa) is more preferable.

In the method of manufacturing the composite sintered body of this embodiment, for example, after the preliminary heating is performed at 1200° C. for 4 hours or more under a vacuum atmosphere, it is preferable that air pressure is returned to the atmospheric pressure with inert gas, for example, argon.

Subsequently, the formed body which has been subjected to the preliminary heating is pressure-sintered by heating the formed body to a temperature of 1600° C. or higher while compacting it with a pressure of 5 MPa or more in an inert gas atmosphere, for example, an argon atmosphere (a second non-oxidative atmosphere). According to such an operation, sintering of the aluminum oxide particles or the silicon carbide particles which are included in the formed body progresses, and thus a dense sintered body having few pores is obtained. The temperature of 1600° C. or higher can be selected as necessary. The pressure can also be selected optionally.

In the method of manufacturing the composite sintered body of this embodiment, sintering can be performed, for example, under an argon atmosphere, at a temperature of 1600° C. or more and 1850° C. or less and a sintering pressure of 25 MPa or more and 50 MPa or less.

In the sintered body obtained by being manufactured by such a method, the amount of metal impurities is reduced, and thus the sintered body having high purity is obtained. In a case where the amount of metal impurities does not reach a target value, it is favorable if the preliminary heating time is lengthened or the preliminary heating temperature is increased.

Figure 4:
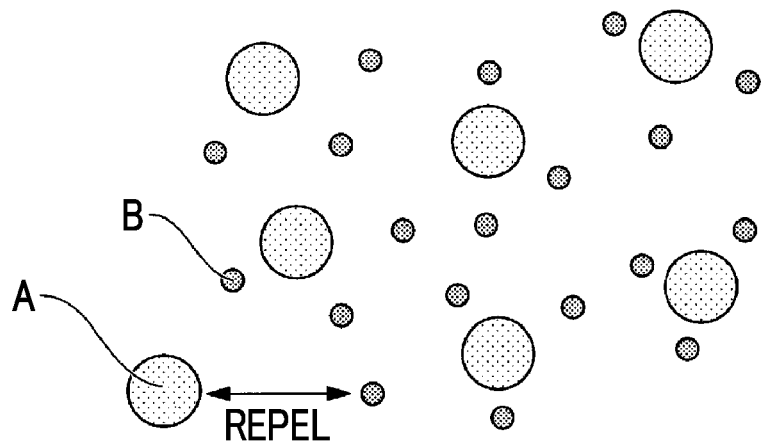
FIG. 4 is a schematic explanatory diagram for explaining an example of a preferred method of manufacturing the composite sintered body according to the present invention.
Figure 5:
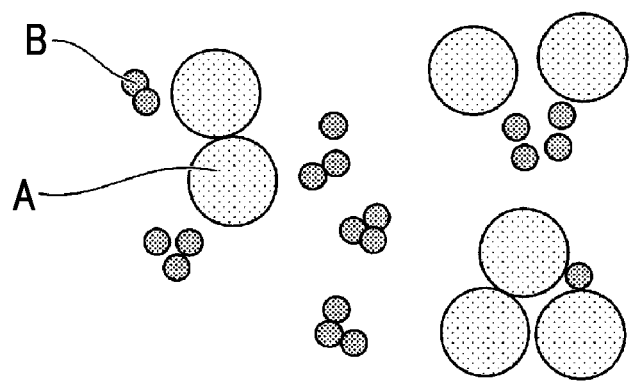
FIG. 5 is a schematic explanatory diagram for explaining an example of the preferred method of manufacturing the composite sintered body according to the present invention.
Figure 6:
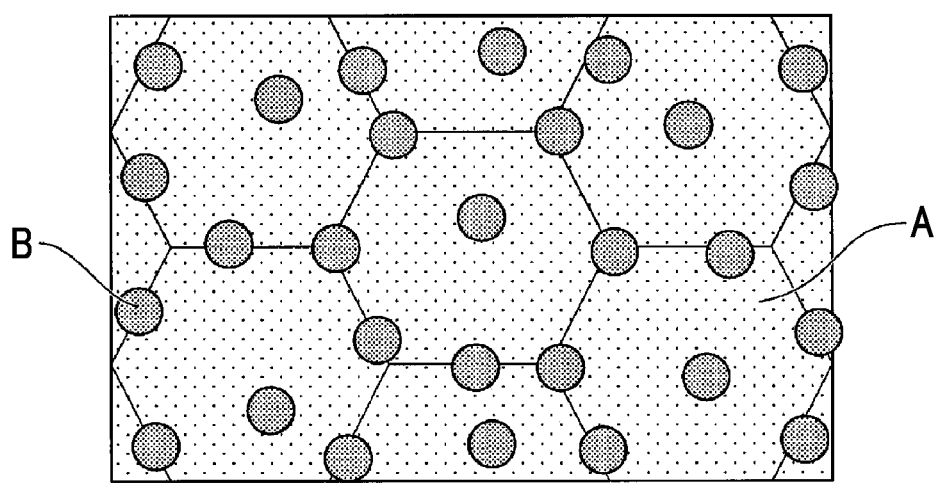
FIG. 6 is a schematic explanatory diagram for explaining an example of the preferred method of manufacturing the composite sintered body according to the present invention.
Figure 7:
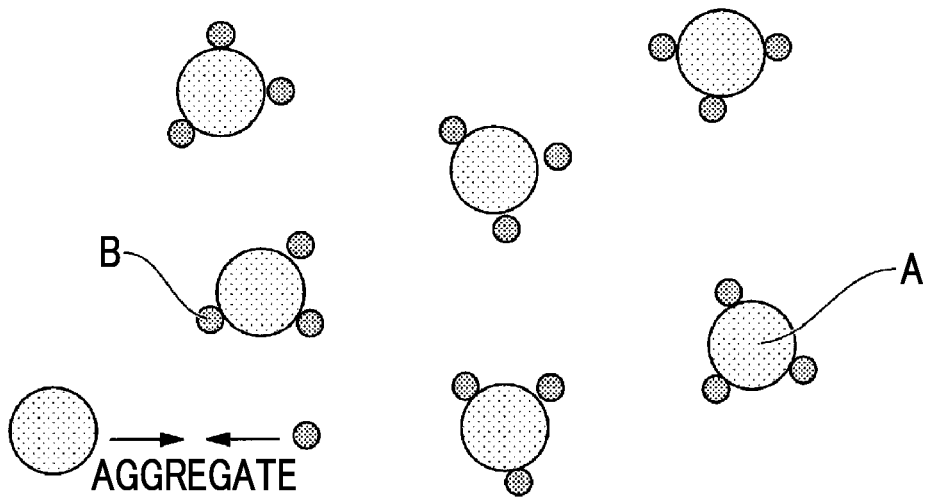
FIG. 7 is a schematic explanatory diagram for explaining an example of the preferred method of manufacturing the composite sintered body according to the present invention.
Figure 8:
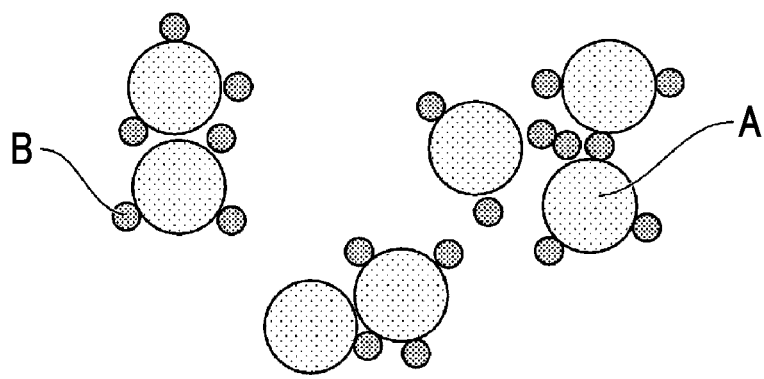
FIG. 8 is a schematic explanatory diagram for explaining an example of the preferred method of manufacturing the composite sintered body according to the present invention.
Figure 9:
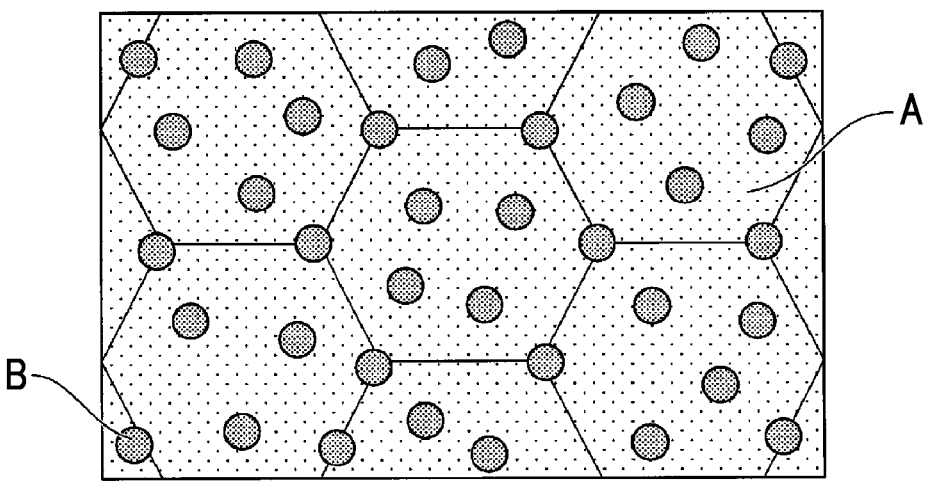
FIG. 9 is a schematic explanatory diagram for explaining an example of the preferred method of manufacturing the composite sintered body according to the present invention.

FIGS. 4 to 9 are explanatory diagrams for explaining the method of manufacturing the composite sintered body of this embodiment. FIGS. 4 to 6 schematically show the state of particles at each stage in a case where the pH of the slurry is adjusted to about pH 11, and FIGS. 7 to 9 schematically show the state of particles at each stage in a case where the pH of the slurry is adjusted to about pH 6.5. These drawings will be described below.

First, a step without pH adjustment will be described.

FIG. 4 is a schematic diagram showing the state of particles in slurry having pH of about 11, for example. FIG. 5 is a schematic diagram showing the state of particles when the dispersion medium is removed from the slurry shown in FIG. 4. FIG. 6 is a schematic view showing a composite sintered body manufactured using the particles shown in FIG. 5.

In FIG. 6, the hexagon in each drawing indicates the crystal grain of aluminum oxide which is a main phase. Further, in FIG. 6, the black circle in each drawing indicates the crystal grain of silicon carbide which is a sub-phase, and the size of the black circle shows the size of the crystal grain of silicon carbide.

In FIG. 4, symbol A indicates an aluminum oxide particle, and symbol B indicates a silicon carbide particle. As shown in FIG. 3 described above, in the slurry having pH of about 11, both the aluminum oxide particle and the silicon carbide particle have a negatively charged surface (the $\zeta$ potential is negative), and therefore, the particles repel each other in a slurry system.

In this way, as shown in FIG. 5, when the dispersion medium is removed in the (c) forming step, a situation occurs in which it is difficult for different types of particles to be uniformly mixed with each other and the same type of particles easily aggregate.

As a result, in the (d) sintering step, the aluminum oxide particles are easily sintered with each other in the form excluding the silicon carbide particles.

For this reason, as shown in FIG. 6, in the obtained composite sintered body, many crystal grains of the silicon carbide are present at crystal grain boundaries in the form of being excluded from the crystal grain of the aluminum oxide. Further, the crystal grain of the silicon carbide, which is present in the crystal grain of the aluminum oxide, tends to grow greatly, and the number of particles also tends to decrease.

Next, a step with pH adjustment will be described.

On the other hand, FIG. 7 is a schematic diagram showing, for example, the state after the slurry of FIG. 4 is adjusted from pH 11 to about pH 6.5. FIGS. 7 to 9 are drawings corresponding to FIGS. 4 to 6, respectively.

As shown in FIG. 7, in the slurry having pH of about 6.5, the surface of the aluminum oxide particle is positively charged (the ζ potential is positive), and the surface of the silicon carbide particle is negatively charged (the ζ potential is negative).

For this reason, heteroaggregation occurs in the slurry system, and thus the silicon carbide particles which are relatively small particles adhere to the surface of the aluminum oxide particle which is a relatively large particle.

On the other hand, in the method of manufacturing the composite sintered body of this embodiment, if the pH of the slurry is adjusted to about 6.5 and the ζ potential of the silicon carbide particle is lowered, the possibility of aggregation (homoaggregation) between the silicon carbide particles also increases.

In contrast, in a case where the silicon carbide particles which are used as described above are pre-oxidized, the dispersibility of the silicon carbide particles is improved. For this reason, in a case of using the silicon carbide particles subjected to the pre-oxidation treatment, the homoaggregation of the silicon carbide particles is suppressed and the heteroaggregation can be advanced dominantly. In this way, a desired aggregation state is easily obtained.

As shown in FIG. 8, when the dispersion medium is removed in the (c) forming step, the aluminum oxides in which silicon carbide has already adhered to the surface aggregate, whereby a situation occurs in which it is easy for different types of particles to be uniformly mixed with each other. As a result, in the (d) sintering step, the aluminum oxide particles are easily sintered together while the silicon carbide particles are incorporated therein.

For this reason, as shown in FIG. 9, in the composite sintered body which is obtained, the aluminum oxide grows while taking in a large number of silicon carbide crystal grains. For this reason, the amount of the crystal grains of the silicon carbide which are present at the crystal grain boundaries of the aluminum oxide is reduced. Further, also in the crystal grain of the aluminum oxide, the crystal grain of the silicon carbide tends to become small and the number of particles also tends to increase.

Further, when the aluminum oxide particles during sintering grow, silicon carbide having a relatively large crystal grain also moves according to the movement of the aluminum oxide particle (grain boundary). With this movement, the silicon carbide having a large crystal grain is more likely to come into contact with other silicon carbide crystal grains, and the grain growth is facilitated.

On the other hand, even if the aluminum oxide particle moves, silicon carbide having a relatively small crystal grain hardly follows this movement. For this reason, silicon carbide having a small crystal grain is easily incorporated into the aluminum oxide grain boundary as a small crystal grain.

As a result, the second crystal grains which are present in the crystal grain tend to become smaller than the third crystal grains 130 which are present at the crystal grain boundaries.

By the above steps, the composite sintered body of this embodiment can be manufactured.

The obtained composite sintered body can be ground in a subsequent step to form a desired base. The projections formed on the placing surface of the base can be appropriately formed by a known method.

The composite sintered body as described above has excellent temperature uniformity.

Further, the electrostatic chuck part and the electrostatic chuck device using such a composite sintered body have excellent temperature uniformity and high performance capable of realizing high processing accuracy in a case of being applied to a processing device.

The preferred embodiment according to the present invention has been described above with reference to the accompanying drawings. However, it goes without saying that the present invention is not limited to such an example. Various shapes, combinations, or the like of the respective constituent members shown in the example described above are examples, and various modifications can be made based on design requirements or the like within a scope which does not depart from the gist of the present invention.

EXAMPLE

The present invention will be described below with reference to examples. However, the present invention is not limited to these examples. Further, in the following description, the configuration of the composite sintered body which is obtained will be described using the respective symbols shown in FIG. 2, as necessary.

<Evaluation Method>
(Confirmation of Composition of Sintered Body)

A sample was prepared by treating the surface of the obtained composite sintered body by mechanical polishing and ion milling. The treated surface of the obtained sample by the above-mentioned treatment was confirmed by an EDX detector (model number: JED-2300, manufactured by JEOL Ltd.) using an atomic resolution analytical electron microscope (model number: JEM-ARM200FDual-X, manufactured by JEOL Ltd.). The results are shown in Table 1.

(Mullite Confirmation)

The inter-lattice distance of mullite was confirmed by observing the treated surface of the sample by using an atomic resolution analytical electron microscope (model number: JEM-ARM200F Dual-X, manufactured by JEOL Ltd.), and performing FFT analysis of the obtained bright-field STEM image. In this way, the formation of mullite was confirmed.

(Ratio (Area Ratio) of a Total of the Second Crystal Grains to a Total of the Third Crystal Grains)

In this example, the surface of a composite oxide (a sintered body) was mirror-polished with a diamond paste of 3 μm, and thereafter, thermal etching was performed at 1400° C. for 30 minutes under an argon atmosphere.

The surface of the obtained sintered body was subjected to structure observation at a magnification of 10000 times by using a scanning electron microscope (model number: S-4000, manufactured by Hitachi High-Technologies Corporation).

The obtained electron micrograph was incorporated into image analysis type particle size distribution measurement software (Mac-View Version 4) and the area of 200 or more silicon carbide particles which are present at the crystal boundaries or in the crystal grain was calculated. From the electron micrograph, whether or not each silicon carbide particle is present in the crystal grain of a metal oxide was determined. Further, the ratio of the crystal grains of silicon carbide as the second crystal grains dispersed in the crystal grains of the metal oxide to a total of the silicon carbide particles as the third crystal grains from which the area was calculated was determined by using the result of the FFT analysis of the STEM image together.

(Average Crystal Grain Size of First Crystal Grains)

The above electron micrograph was incorporated into image analysis type particle size distribution measurement software (Mac-View Version 4), and the major axis diameters of 200 or more first crystal grains were calculated. The arithmetic mean value of the obtained major axis diameters of the respective crystal grains was taken as the "average crystal grain size" to be determined.

(Thermal Conductivity)

The thermal conductivity was calculated from the measurement result of thermal diffusivity by a laser flash method and the measurement result of specific heat by a DSC method.

(Temperature Uniformity)

As a test body for evaluating the temperature uniformity, a sintered body having a diameter of 350 mm and a thickness of 1 mm was prepared and used as a test body. Specifically, after a sintered body having a diameter of 350 mm and a thickness greater than 1 mm was prepared, the surface was subjected to surface grinding to adjust the thickness, thereby obtaining a sintered body (test body) having a thickness of 1 mm.

The obtained test body for temperature uniformity evaluation was clamped by a first metal plate having a diameter of 350 mm and having a heater and a second metal plate having a diameter of 350 mm.

The test body was heated using a heating plate, and a temperature gradient was applied such that the temperature of the test body was higher on the heating plate side and lower on the cooling plate side. Five minutes after the start of heating, it was considered that the heat flow of the test plate was in a steady state, and the temperatures at three locations on the surface of the test body on the cooling plate side were measured.

The measurement positions were determined to be a central portion (coordinate position 0, 0) of the test body, a portion at −160 mm (coordinate position −160, 0) in a 270° direction from the central portion of the test body, and a portion at 160 mm (160, 0) in a 90° direction from the central portion).

If the difference between the maximum value and the minimum value of the measured temperature was within 5° C. at the three temperature measurement positions, the temperature uniformity was evaluated as being good. Further, in a case where the difference between the maximum value and the minimum value of the measured temperature exceeded 5° C., the temperature uniformity was evaluated as being poor.

Example 1

As a starting material, β-SiC type silicon carbide (β-SiC) particles having an average particle diameter of 0.03 μm and synthesized by thermal plasma CVD, and aluminum oxide ($Al_2O_3$) particles having an average particle diameter of 0.1 μm and the amount of metal impurity of 95 ppm were used.

With respect to the β-SiC particles, the particle surface was oxidized by performing heating treatment at 500° C. for 12 hours under the air atmosphere. Hereinafter, the above oxidation treatment is referred to as "pre-oxidation". In the following steps, β-SiC subjected to the pre-oxidation treatment was used.

Weighing was performed such that the β-SiC particles are 8.5% by mass with respect to the total amount of the β-SiC particles and the $Al_2O_3$ particles, and the β-SiC particles and the $Al_2O_3$ particles were put in distilled water containing a dispersant.

Further, the ratio of the total of the β-SiC particles and the $Al_2O_3$ particles to the distilled water was set to be 60% by mass. The dispersion liquid with the β-SiC particles and the $Al_2O_3$ particles put therein was subjected to dispersion treatment by an ultrasonic dispersing device and then pulverized and mixed by using a two-stream particle collision type pulverizing and mixing device.

With respect to the obtained mixed solution, nitric acid was added to slurry to adjust pH of the slurry to 6.5.

The slurry with adjusted pH was spray-dried by a spray dryer to obtain dry mixed particles of β-SiC and $Al_2O_3$.

The mixed particles were subjected to uniaxial press forming at a press pressure of 8 MPa to obtain a formed body having a diameter of 320 mm and a thickness of 15 mm.

The obtained formed body was set in a graphite mold and the temperature was raised to 370° C. without applying a press pressure to remove moisture and a dispersant (contaminants). Thereafter, the formed body with the contaminants removed therefrom was heated to 370° C. in the atmosphere to oxidize the surfaces of the p-sic particles included in the formed body.

Thereafter, sintering was performed at a press pressure of 40 MPa and a temperature of 1800° C. in an argon atmosphere to obtain a composite sintered body of Example 1.

Further, an electron micrograph of the composite sintered body of Example 1 was taken under the conditions described above. When the average crystal grain size of the crystal grains (the first crystal grains 110) of $Al_2O_3$ was determined from the obtained electron micrograph, the average crystal grain size was 0.94 μm.

Figure 10:
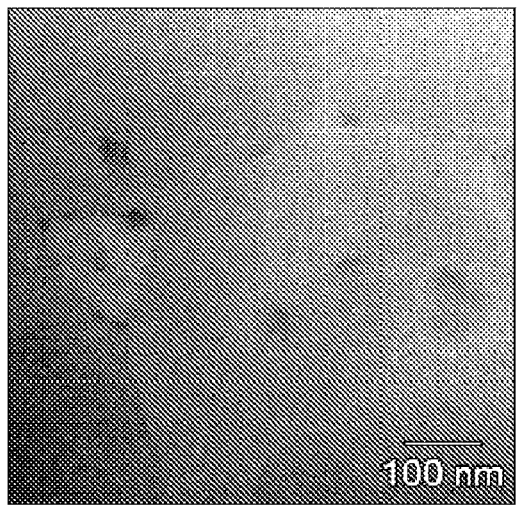
FIG. 10 is a BF-STEM photograph of a composite sintered body obtained in Example 1.
Figure 11:
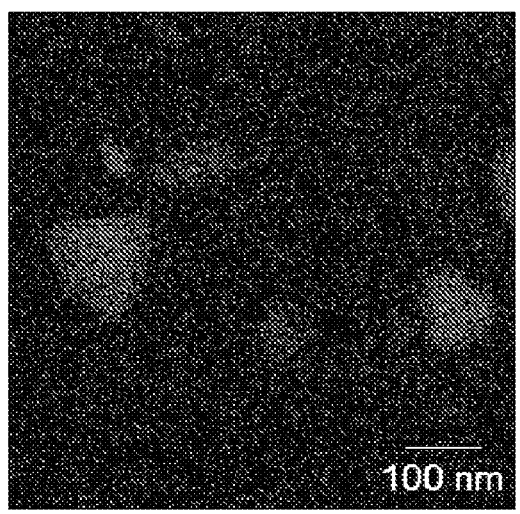
FIG. 11 is an EDX measurement result of the composite sintered body obtained in Example 1.
Figure 12:
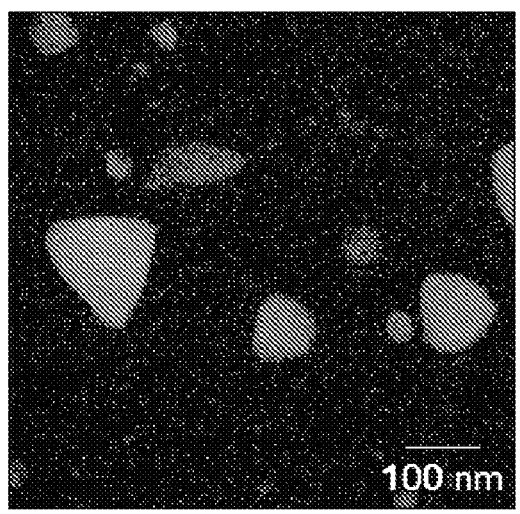
FIG. 12 is an EDX measurement result of the composite sintered body obtained in Example 1.

FIGS. 10 to 12 are EDX mappings showing the EDX measurement results of the composite sintered body of Example 1. FIG. 10 is a BF-STEM photograph of the composite sintered body. FIG. 11 shows an EDX measurement result in which the existing location of carbon is brightly shown in the same field of view as that of FIG. 10. FIG. 12 shows an EDX measurement result in which the existing location of silicon is brightly shown in the same field of view as that of FIG. 10.

According to FIGS. 10 to 12, it can be seen that there is a difference between the existing locations of a silicon atom and a carbon atom. It can be determined that mullite is formed at a location where the silicon atom is present but the carbon atom is not present.

Fast Fourier transform (FFT) analysis was performed on the location which is considered that mullite is formed, and it was confirmed that a diffraction pattern corresponding to mullite of 6.0 angstrom was present.

Further, when the average crystal grain size of the crystal grains (the second crystal grains 120) containing mullite was determined, the average crystal grain size was 0.07 μm.

Further, when the average crystal grain size of the crystal grains (the third crystal grains 130) of SiC was determined, the average crystal grain size was 0.37 μm. The second crystal grain 120 was smaller than the third crystal grain 130.

In the obtained composite sintered body, mullite could not be confirmed at the crystal grain boundaries.

The thermal conductivity of the obtained composite sintered body was 21.1 W/m·K.

Example 2

A composite sintered body of Example 2 was obtained in the same manner as in Example 1 except that the amount of β-SiC particles was 4% by mass with respect to the total amount of β-SiC particles and $Al_2O_3$ particles.

Further, with respect to the composite sintered body of Example 2, an electron micrograph was taken under the above-described conditions. When the average crystal grain size of the crystal grains (the first crystal grains 110) of Al$_2$O$_3$ was determined from the obtained electron micrograph, the average crystal grain size was 1.05 μm.

Further, when the average crystal grain size of the crystal grains (the second crystal grains 120) containing mullite was determined, the average crystal grain size was 0.08 μm.

Further, when the average crystal grain size of the crystal grains (the third crystal grains 130) of SiC was determined, the average crystal grain size was 0.35 μm. The second crystal grain 120 was smaller than the third crystal grain 130.

In the obtained composite sintered body, mullite could not be confirmed at the crystal grain boundaries.

The thermal conductivity of the obtained composite sintered body was 24.0 W/m·K.

Comparative Example 1

As a starting material, β-SiC type β-SiC particles having an average particle diameter of 0.03 μm and synthesized by thermal plasma CVD, and Al$_2$O$_3$ particles having an average particle diameter of 0.1 μm and the amount of metal impurity of 95 ppm were used.

Weighing was performed such that the β-SiC particles are 8.5% by mass with respect to the total amount of the β-SiC particles and the Al$_2$O$_3$ particles, and the β-SiC particles and the Al$_2$O$_3$ particles were put in distilled water containing a dispersant. The dispersion liquid with the β-SiC particles and the Al$_2$O$_3$ particles put therein was subjected to dispersion treatment with an ultrasonic dispersion device and then pulverized and mixed using a two-stream particle collision type pulverization and mixing device.

The obtained mixed solution was spray-dried with a spray-drying device without pH adjustment to obtain mixed particles of β-SiC and Al$_2$O$_3$.

Subsequently, forming was performed in the same manner as in Example 1, and the formed body was heated to 500° C. in a nitrogen atmosphere without applying a press pressure to remove moisture and a dispersant (contaminants). Thereafter, the formed body with the contaminants removed therefrom was heated to 400° C. in the atmosphere to oxidize the surfaces of the β-SiC particles included in the formed body.

The obtained formed body was set in a graphite mold and subjected to pressure-sintering. First, the formed body was heated to 1200° C. in a vacuum atmosphere without applying a press pressure. Thereafter, sintering was performed at a press pressure of 40 MPa and a temperature of 1800° C. in an argon atmosphere to obtain a sintered body of Comparative Example 1.

Further, an electron micrograph of the composite sintered body of Comparative Example 1 was taken under the conditions described above. When the average crystal grain size of the crystal grains (the first crystal grains 110) of Al$_2$O$_3$ was determined from the obtained electron micrograph, the average crystal grain size was 0.78 μm.

Further, mullite could not be confirmed in the crystal grains of the first crystal grains 110.

Further, when the average crystal grain size of the crystal grains (the third crystal grains 130) of SiC was determined, the average crystal grain size was 0.31 μm.

In the obtained composite sintered body, mullite could not be confirmed at the crystal grain boundaries as well.

The thermal conductivity of the obtained composite sintered body was 28.8 W/m·K.

The evaluation results of Examples 1 and 2 and Comparative Example 1 are shown in Tables 1 and 2. Table 1 is a table in which the compositions and crystal grains of the sintered bodies of Examples 1 and 2 and Comparative Example 1 are summarized. Table 2 is a table in which the evaluation results for Examples 1 and 2 and Comparative Example 1 are summarized.

In Table 2, in a case where the temperature uniformity is good, it is indicated by "o", and in a case where the temperature uniformity is poor, it is indicated by "x".

TABLE 1

|  | Sintered body composition (% by volume) | | | Crystal grain size (μm) | | |
| --- | --- | --- | --- | --- | --- | --- |
|  | Al$_2$O$_3$ | SiC | mullite | Al$_2$O$_3$ | SiC | mullite |
| Example 1 | 90.18 | 8.38 | 1.44 | 0.94 | 0.37 | 0.07 |
| Example 2 | 86.69 | 10.71 | 2.6 | 1.05 | 0.35 | 0.08 |
| Comparative Example 1 | 90.14 | 9.86 | 0 | 0.78 | 0.31 | — |

TABLE 2

|  | Thermal conductivity (W/m · K) | Temperature uniformity evaluation |
| --- | --- | --- |
| Example 1 | 21.1 | o |
| Example 2 | 24.0 | o |
| Comparative Example 1 | 28.8 | x |

As a result of the evaluation, the composite sintered bodies of the examples had lower thermal conductivity than the composite sintered body of the comparative example.

Further, as a result of the temperature uniformity evaluation, the composite sintered bodies of the examples showed better temperature uniformity than the composite sintered body of the comparative example.

From the above results, it was found that the present invention is useful.

INDUSTRIAL APPLICABILITY

A new composite sintered body having high temperature uniformity is provided. Further, an electrostatic chuck part and an electrostatic chuck device using such a composite sintered body are provided.

REFERENCE SIGNS LIST

1: electrostatic chuck device
2: electrostatic chuck part
3: temperature adjusting base part
3A: flow path
3b: through-hole
4: adhesion layer
5: heater element
6: adhesion layer
7: insulating plate
8: adhesive layer
10: focus ring
11: placing plate (base)
11a: placing surface
11b: projection portion
12: supporting plate (base)

13: electrostatic attraction electrode
14: insulating material layer
15: power supply terminal
15a: insulator
16: through-hole
17: power supply terminal
18: tubular insulator
19: groove
20: temperature sensor
21: installation hole
22: temperature measurement part
23: excitation unit
24: fluorescence detector
25: control unit
28: gas hole
29: tubular insulator
A: aluminum oxide particle
B: silicon carbide particle
W: plate-shaped sample
100: composite sintered body
110: first crystal grain
110a: crystal grain boundary
120: second crystal grain
130: third crystal grain
140: fourth crystal grain

The invention claimed is:

1. A composite sintered body, wherein
the composite sintered body consists of a ceramic composite sintered body,
the ceramic composite sintered body comprises
aluminum oxide as a main phase, and
silicon carbide as a sub-phase,
wherein the composite sintered body has mullite in crystal grains of the aluminum oxide,
the composite sintered body not having mullite at crystal grain boundaries of the aluminum oxide, and the mullite representing an aluminum silicate compound, and
wherein performance of elemental analysis of any cross section of the composite sintered body is performed by energy dispersive X-ray analysis, and a location where a carbon atom is not detected among locations where a silicon atom is detected, is determined as the mullite.

2. The composite sintered body according to claim 1, wherein when crystal grains are defined such that
crystal grains of the aluminum oxide are defined as first crystal grains,
crystal grains which are dispersed in the crystal grains of the first crystal grains and contain the mullite are defined as second crystal grains, and
crystal grains of the silicon carbide which are present at crystal grain boundaries of the first crystal grains are defined as third crystal grains,
an average crystal grain size of the first crystal grains is 0.5 µm or more and 10 µm or less, and
an average crystal grain size of the second crystal grains is smaller than an average crystal grain size of the third crystal grains.

3. The composite sintered body according to claim 1, wherein when crystal grains are defined such that
the crystal grains of the aluminum oxide are defined as first crystal grains,
crystal grains which are dispersed in the crystal grains of the first crystal grains and contain the mullite are defined as second crystal grains, and
crystal grains of the silicon carbide which are present at crystal grain boundaries of the first crystal grains are defined as third crystal grains,
a ratio of a total of the second crystal grains to a total of the third crystal grains is 20% or more and 40% or less in terms of an area ratio in an arbitary cross section of the composite sintered body.

4. The composite sintered body according to claim 1, wherein a content of the mullite in the composite sintered body is 1.2% or more and 3.5% or less in terms of an area ratio in an arbitary cross section of the composite sintered body.

5. An electrostatic chuck member comprising:
a plate-shaped base which has one principal surface as a placing surface on which a plate-shaped sample is placed, wherein the base is formed of the composite sintered body according to claim 1, as a forming material; and
an electrostatic attraction electrode which is provided on a side opposite to the placing surface of the base, or in an interior of the base.

6. An electrostatic chuck device comprising:
the electrostatic chuck member according to claim 5.

7. The composite sintered body according to claim 1, including
the crystal grains of the aluminum oxide as first crystal grains, and
crystal grains of the silicon carbide, wherein
the silicon carbide is β-SiC,
the crystal grains of the silicon carbide do not contain mullite,
at least some of the crystal grains of the silicon carbide are located as third crystal grains at crystal grain boundaries of the crystal grains of the aluminum oxide, and remaining crystal grains of the silicon carbide are located in the crystal grains of the aluminum oxide as fourth crystal grains,
the crystal grains of the aluminum oxide include in an interior thereof at least one of, as second crystal grains,
crystal grains which consists of the mullite and
crystal grains which include the mullite and silicon carbide which is the β-SiC,
the amount of the β-SiC in the composite sintered body is 4% by volume or more and 15% by volume or less, and
a content of the mullite in the composite sintered body is 1.2% or more and 3.5% or less in terms of an area ratio in a cross section of the composite sintered body.

8. The composite sintered body according to claim 1, wherein the mullite is produced by a reaction of silicon carbide with aluminum oxide, which are raw materials of the composite sintered body.

9. A composite sintered body, wherein
the composite sintered body consists of a ceramic composite sintered body,
the ceramic composite sintered body comprises
aluminum oxide as a main phase, and
silicon carbide as a sub-phase,
wherein the composite sintered body has mullite in crystal grains of the aluminum oxide, and
wherein when crystal grains are defined such that
the crystal grains of the aluminum oxide are defined as first crystal grains,
crystal grains which are dispersed in the crystal grains of the first crystal grains and contain the mullite are defined as second crystal grains, and
crystal grains of the silicon carbide which are present at crystal grain boundaries of the first crystal grains are defined as third crystal grains,
a ratio of a total of the second crystal grains to a total of the third crystal grains is 20% or more and 40% or less in terms of an area ratio in an arbitrary cross section of the composite sintered body.

10. The composite sintered body according to claim 9, wherein the composite sintered body does not have mullite at crystal grain boundaries of the aluminum oxide.

11. The composite sintered body according to claim 9, wherein when crystal grains are defined such that the crystal grains of the aluminum oxide are defined as first crystal grains,
- crystal grains which are dispersed in the crystal grains of the first crystal grains and contain the mullite are defined as second crystal grains, and
- crystal grains of the silicon carbide which are present at crystal grain boundaries of the first crystal grains are defined as third crystal grains,
- wherein an average crystal grain size of the first crystal grains is from about 0.5 μm to about 10 μm, and
- an average crystal grain size of the second crystal grains is smaller than an average crystal grain size of the third crystal grains.

12. A composite sintered body, wherein the composite sintered body consists of a ceramic composite sintered body,
- the ceramic composite sintered body comprises
- aluminum oxide as a main phase, and
- silicon carbide as a sub-phase,
- wherein the composite sintered body has mullite in crystal grains of the aluminum oxide, and
- a content of the mullite in the composite sintered body is from about 1.2% to about 3.5% in terms of an area ratio in an arbitrary cross section of the composite sintered body.

13. The composite sintered body according to claim 12, wherein the composite sintered body does not have mullite at crystal grain boundaries of the aluminum oxide.

14. The composite sintered body according to claim 12, wherein when crystal grains are defined such that crystal grains of the aluminum oxide are defined as first crystal grains,
- crystal grains which are dispersed in the crystal grains of the first crystal grains and contain the mullite are defined as second crystal grains, and
- crystal grains of the silicon carbide which are present at crystal grain boundaries of the first crystal grains are defined as third crystal grains,
- wherein an average crystal grain size of the first crystal grains is from about 0.5 μm to about 10 μm, and
- an average crystal grain size of the second crystal grains is smaller than an average crystal grain size of the third crystal grains.

15. The composite sintered body according to claim 1, wherein when the elemental analysis of any cross section of the composite sintered body is performed, the mullite is observed by the energy dispersive X-ray analysis as a portion where carbon atom is not detected but a silicon atom is detected.

16. The composite sintered body according to claim 15, wherein whether or not the mullite is formed is confirmed by a Fast Fourier transform analysis (FFT) of the portion where carbon atom is not detected but a silicon atom is detected.

* * * * *